(12) United States Patent
Fang et al.

(10) Patent No.: US 6,528,805 B2
(45) Date of Patent: Mar. 4, 2003

(54) DOSE MONITOR FOR PLASMA DOPING SYSTEM

(75) Inventors: Ziwei Fang, Sunnyvale, CA (US); Matthew Goeckner, Plano, TX (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 09/916,998

(22) Filed: Jul. 27, 2001

(65) Prior Publication Data

US 2001/0042827 A1 Nov. 22, 2001

Related U.S. Application Data

(60) Division of application No. 09/455,550, filed on Dec. 6, 1999, now Pat. No. 6,300,643, which is a continuation-in-part of application No. 09/128,370, filed on Aug. 3, 1998, now Pat. No. 6,020,592.

(51) Int. Cl.$^7$ .............................................. H01J 37/244
(52) U.S. Cl. ................... 250/492.21; 250/397
(58) Field of Search ............................ 250/492.1, 397; 324/71.3, 72

(56) References Cited

U.S. PATENT DOCUMENTS

| 4,021,675 A | 5/1977 | Shifrin |
| 4,135,097 A | 1/1979 | Forneris et al. |
| 4,228,358 A | 10/1980 | Ryding |

(List continued on next page.)

FOREIGN PATENT DOCUMENTS

| EP | 0 532 283 A1 | 3/1993 |
| EP | 0 860 854 A1 | 8/1998 |
| EP | 0 994 203 A2 | 4/2000 |

OTHER PUBLICATIONS

Peter Kellerman, "PIII Dosimetry," Eaton, Implant Systems Division, Apr. 1999, pp. 1–13.
*E.C. Jones et al, "Plasma Doping Dosimetry", IEEE Trans. On Plasma Science, vol. 25, No. 1, Feb. 1997 pp. 42–52.
D.M. Jamba, "Dosimetry Measurement In Ion Implanters," Nuclear Instruments and Methods 189 pp. 253–263, North Holland Publishing Company(1981).
C.M. McKenna, "High Current Dosimetry Techniques," Radiation Effects, vol. 44, pp. 93–110, (1979).
D.M. Jamba, "Semiconductor Measurement Technology: Some Aspects of Dose Measurement for Accurate Ion Implantation," NBS Special Publication 400–39, pp. 1–36 (Issued Jul. 1977).

(List continued on next page.)

Primary Examiner—Kiet T. Nguyen

(57) ABSTRACT

Plasma doping apparatus includes a plasma doping chamber, a platen mounted in the plasma doping chamber for supporting a workpiece such as a semiconductor wafer, a source of ionizable gas coupled to the chamber, an anode spaced from the platen and a pulse source for applying voltage pulses between the platen and the anode. The voltage pulses produce a plasma having a plasma sheath in the vicinity of the workpiece. The voltage pulses accelerate positive ions across the plasma sheath toward the platen for implantation into the workpiece. The plasma doping apparatus includes at least one Faraday cup positioned adjacent to the platen for collecting a sample of the positive ions accelerated across the plasma sheath. The sample is representative of the dose of positive ions implanted into the workpiece. The Faraday cup may include a multi-aperture cover for reducing the risk of discharge within the interior chamber of the Faraday cup. The Faraday cup may be configured to produce a lateral electric field within the interior chamber for suppressing escape of electrons, thereby improving measurement accuracy.

6 Claims, 8 Drawing Sheets

U.S. PATENT DOCUMENTS

| | | |
|---|---|---|
| 4,234,797 A | 11/1980 | Ryding |
| 4,361,762 A | 11/1982 | Douglas |
| 4,421,988 A | 12/1983 | Robertson et al. |
| 4,433,247 A | 2/1984 | Turner |
| 4,463,255 A | 7/1984 | Robertson et al. |
| 4,539,217 A | 9/1985 | Farley |
| 4,587,433 A | 5/1986 | Farley |
| 4,595,837 A | 6/1986 | Wu et al. |
| 4,744,938 A | 5/1988 | Ruddy |
| 4,751,393 A | 6/1988 | Corey Jr. et al. |
| 4,764,394 A | 8/1988 | Conrad |
| 4,786,814 A | 11/1988 | Kolondra et al. |
| 4,937,205 A | 6/1990 | Nakayama et al. |
| 5,015,493 A | 5/1991 | Gruen |
| 5,103,161 A | 4/1992 | Bogaty |
| 5,126,163 A | 6/1992 | Chan |
| 5,206,180 A | 4/1993 | Yoshida |
| 5,286,676 A | 2/1994 | Kruger et al. |
| 5,289,010 A | 2/1994 | Shohet |
| 5,354,381 A | 10/1994 | Sheng |
| 5,374,456 A | 12/1994 | Matossian et al. |
| 5,572,038 A | 11/1996 | Sheng et al. |
| 5,583,427 A | 12/1996 | Teruya et al. |
| 5,653,811 A | 8/1997 | Chan |
| 5,654,043 A | 8/1997 | Shao et al. |
| 5,658,423 A | 8/1997 | Angell et al. |
| 5,711,812 A | 1/1998 | Chapek et al. |
| 5,728,253 A | 3/1998 | Saito et al. |
| 5,814,823 A | 9/1998 | Benveniste |
| 5,825,035 A | 10/1998 | Mizumura et al. |
| 5,883,391 A | 3/1999 | Adibi et al. |
| 5,911,832 A | 6/1999 | Denholm et al. |
| 6,020,592 A | 2/2000 | Liebert et al. |
| 6,050,218 A | 4/2000 | Chen et al. |
| 6,101,971 A * | 8/2000 | Denholm et al. ........ 118/723 E |
| 6,300,643 B1 * | 10/2001 | Fang et al.. .......... 250/492.21 |

OTHER PUBLICATIONS

D.M. Jamba, Secondary Particles Collection in Ion Implantation Dose Measurement, Rev. Sci. Instrum., vol. 49, No. 5, pp. 634–638 (May 1978).

E.P. Eernisse et al., "Ion Beam Profile Monitor," Rev. Sci. Instrum., vol. 46, No. 3 pp. 266–268 (Mar. 1975).

* cited by examiner

DOSE MONITOR FOR PLASMA DOPING SYSTEM

CROSS-REFERENCE TO RELATED APPLICATION

This application is a Divisional of prior application Ser. No: 09/455,550 filed on Dec. 6, 1999, entitled DOSE MONITOR FOR PLASMA DOPING SYSTEM and now U.S. Pat. No. 6,300,643, which is a CIP of Ser. No. 9/128,370, filed Aug. 3, 1998, now U.S. Pat. No. 6,020,592.

FIELD OF THE INVENTION

This invention relates to plasma doping systems used for ion implantation of workpieces and, more particularly, to methods and apparatus for measuring the ion dose implanted into the workpiece in plasma doping systems.

BACKGROUND OF THE INVENTION

Ion implantation is a standard technique for introducing conductivity-altering impurities into semiconductor wafers. In a conventional ion implantation system, a desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

In some applications, it is necessary to form shallow junctions in a semiconductor wafer, where the impurity material is confined to a region near the surface of the wafer. In these applications, the high energy acceleration and the related beam forming hardware of conventional ion implanters are unnecessary. Accordingly, it has been proposed to use plasma doping systems for forming shallow junctions in semiconductor wafers. In a plasma doping system, a semiconductor wafer is placed on a conductive platen which functions as a cathode. An ionizable gas containing the desired dopant material is introduced into the chamber, and a high voltage pulse is applied between the platen and an anode or the chamber walls, causing formation of a plasma having a plasma sheath in the vicinity of the wafer. The applied voltage causes ions in the plasma to cross the plasma sheath and to be implanted into the wafer. The depth of implantation is related to the voltage applied between the wafer and the anode. A plasma doping system is described in U.S. Pat. No. 5,354,381 issued Oct. 11, 1994 to Sheng.

In the plasma doping system described above, the high voltage pulse generates a plasma and accelerates positive ions from the plasma toward the wafer. In other types of plasma systems, known as plasma immersion systems, a continuous RF voltage is applied between the platen and the anode, thus producing a continuous plasma. At intervals, a high voltage pulse is applied between the platen and the anode, causing positive ions in the plasma to be accelerated toward the wafer.

Exacting requirements are placed on semiconductor fabrication processes involving ion implantation with respect to the cumulative ion dose implanted into the wafer and dose uniformity across the wafer surface. The implanted dose determines the electrical activity of the implanted region, while dose uniformity is required to ensure that all devices on the semiconductor wafer have operating characteristics within specified limits.

One prior art approach to dose measurement in plasma doping systems involves measurement of the current delivered to the plasma by the high voltage pulses, as described in the aforementioned U.S. Pat. No. 5,354,381. However, this approach is subject to inaccuracies. The measured current includes electrons generated during ion implantation and excludes neutral molecules that are implanted into the workpiece, even though these neutral molecules contribute to the total dose. Furthermore, since the measured current passes through the wafer being implanted, it is dependent on the characteristics of the wafer, which may produce errors in the measured current. Those characteristics include emissivity, local charging, gas emission from photoresist on the wafer, etc. Thus, different wafers give different measured currents for the same ion dose. In addition, the measured current pulses include large capacitive or displacement current components which may introduce errors in the measurement.

A technique for plasma doping dosimetry is described by E. Jones et al. in IEEE *Transactions on Plasma Science*, Vol. 25, No. 1, February 1997, pp. 42–52. Measurements of implanter current and implant voltage are used to determine an implant profile for a single implant pulse. The implant profile for a single pulse is used to project the final implant profile and total implanted dose. This approach is also subject to inaccuracies, due in part to the fact that it depends on power supply and gas control stability to ensure repeatability. Furthermore, the empirical approach is time consuming and expensive.

In conventional ion implantation systems which involve the application of a high energy beam to the wafer, cumulative ion dose is typically measured by a Faraday cup, or Faraday cage, positioned in front of the target wafer. The Faraday cage is typically a conductive enclosure, often with the wafer positioned at the downstream end of the enclosure and constituting part of the Faraday system. The ion beam passes through the Faraday cage to the wafer and produces an electrical current in the Faraday. The Faraday current is supplied to an electronic dose processor, which integrates the current with respect to time to determine the total ion dosage. The dose processor may be part of a feedback loop that is used to control the ion implanter.

Various Faraday cage configurations for ion implanters have been disclosed in the prior art. Faraday cages positioned in front of semiconductor wafers are disclosed in U.S. Pat. No. 4,135,097 issued Jan. 16, 1979 to Forneris et al; U.S. Pat. No. 4,433,247 issued Feb. 21, 1984 to Turner; U.S. Robertson et al; U.S. Pat. No. 4,463,255 issued Jul. 31, 1984 to Robertson et al; U.S. Pat. No. 4,361,762 issued Nov. 30, 1982 to Douglas; U.S. Pat. No. 4,786,814 issued Nov. 22, 1988 to Kolondra et al; and U.S. Pat. No. 4,595,837 issued Jun. 17, 1986 to Wu et al. Faraday cages positioned behind a rotating disk are disclosed in U.S. Pat. No. 4,228,358 issued Oct. 14, 1980 to Ryding; U.S. Pat. No. 4,234,797 issued Nov. 18, 1980 to Ryding; and U.S. Pat. No. 4,587,433 issued May 6, 1986 to Farley.

Dose and dose uniformity have also been measured in conventional high energy ion implantation systems using a corner cup arrangement as disclosed in U.S. Pat. No. 4,751,393 issued Jun. 14, 1988 to Corey, Jr. et al. A mask having a central opening is positioned in the path of the ion beam. The beam is scanned over the area of the mask with the portion passing through the central opening impinging on the wafer. Small Faraday cups are located at the four corners of the mask and sense the beam current at these locations.

Accordingly, there is a need for improved methods and apparatus for measuring ion dose implanted into a workpiece in plasma doping systems.

SUMMARY OF THE INVENTION

According a first aspect of the invention, plasma doping apparatus is provided. The plasma doping apparatus comprises a plasma doping chamber, a platen mounted in the plasma doping chamber for supporting a workpiece, typically a semiconductor wafer, wherein the platen and the workpiece constitute a cathode, a source of ionizable gas coupled to the chamber, an anode spaced from the platen and a pulse source for applying high voltage pulses between the cathode and the anode. The high voltage pulses ,Produce a plasma having a plasma sheath in the vicinity of the workpiece. The plasma contains positive ions of the ionizable gas. The high voltage pulses accelerate the positive ions across the plasma sheath toward the platen for implantation into the workpiece. The plasma doping apparatus further comprises one or more Faraday cups positioned adjacent to the platen for collecting a sample of the positive ions accelerated across the plasma sheath. The sample is representative of the dose of positive ions implanted into the workpiece. The Faraday cup has a cover with a plurality of apertures. The ions collected by the Faraday cup pass through the apertures into an interior chamber of Faraday cup and are detected.

Preferably, each of the apertures has a width that is less than the thickness of the plasma sheath. The width of each aperture is selected to prevent formation of a discharge within the interior chamber of the Faraday cup.

In one embodiment, the cover comprises a multi-aperture plate. In another embodiment, the cover comprises a wire mesh. In a further embodiment, the cover of the Faraday cup may comprise a front conductor facing the plasma, a back conductor facing the interior chamber of the Faraday and an insulator separating the front conductor and the back conductor. The back conductor may be biased to repel electrons.

According to a second aspect of the invention, plasma doping apparatus is provided. The plasma doping apparatus comprises a plasma doping chamber, a platen mounted in the plasma doping chamber for supporting a workpiece, typically a semiconductor wafer, wherein the platen and the workpiece constitute a cathode, a source of ionizable gas coupled to the chamber, an anode spaced from the platen and a pulse source for applying voltage pulses between the cathode and the anode. The voltage pulses produce a plasma having a plasma sheath in the vicinity of the workpiece. The plasma contains positive ions of the ionizable gas. The voltage pulses accelerate the positive ions across the plasma sheath toward the platen for implantation into the workpiece. The plasma doping apparatus further comprises one or more Faraday cups positioned adjacent to the platen for collecting a sample of the positive ions accelerated across the plasma sheath. The sample is representative of the dose of positive ions implanted into the workpiece. The Faraday cup includes means for producing within an interior chamber of the Faraday cup an electric field lateral to the direction of ions entering the Faraday cup.

The means for producing electric fields may comprise an electrode located within the interior chamber of the Faraday cup and a supply voltage coupled to the electrode for biasing the electrode with respect to a wall of the Faraday cup. When the interior chamber of the Faraday cup is cylindrical, the electrode may comprise an axial conductor located within the interior chamber. When the Faraday cup has an annular configuration, the electrode may comprise an annular electrode located between inner and outer walls of the Faraday cup. In another embodiment, an annular Faraday cup may have electrically isolated inner and outer walls. A voltage may be applied between the inner and outer walls for producing within the interior chamber of the Faraday cup an electric field lateral to the direction of movement of the ions entering the Faraday cup.

The apparatus may include a single Faraday cup or two or more Faraday cups disposed around the platen. The plasma doping apparatus may include a guard ring, and the Faraday cup may be embedded within the guard ring. The guard ring can be maintained at either the cathode potential or at another potential which is selected to control the plasma uniformity.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
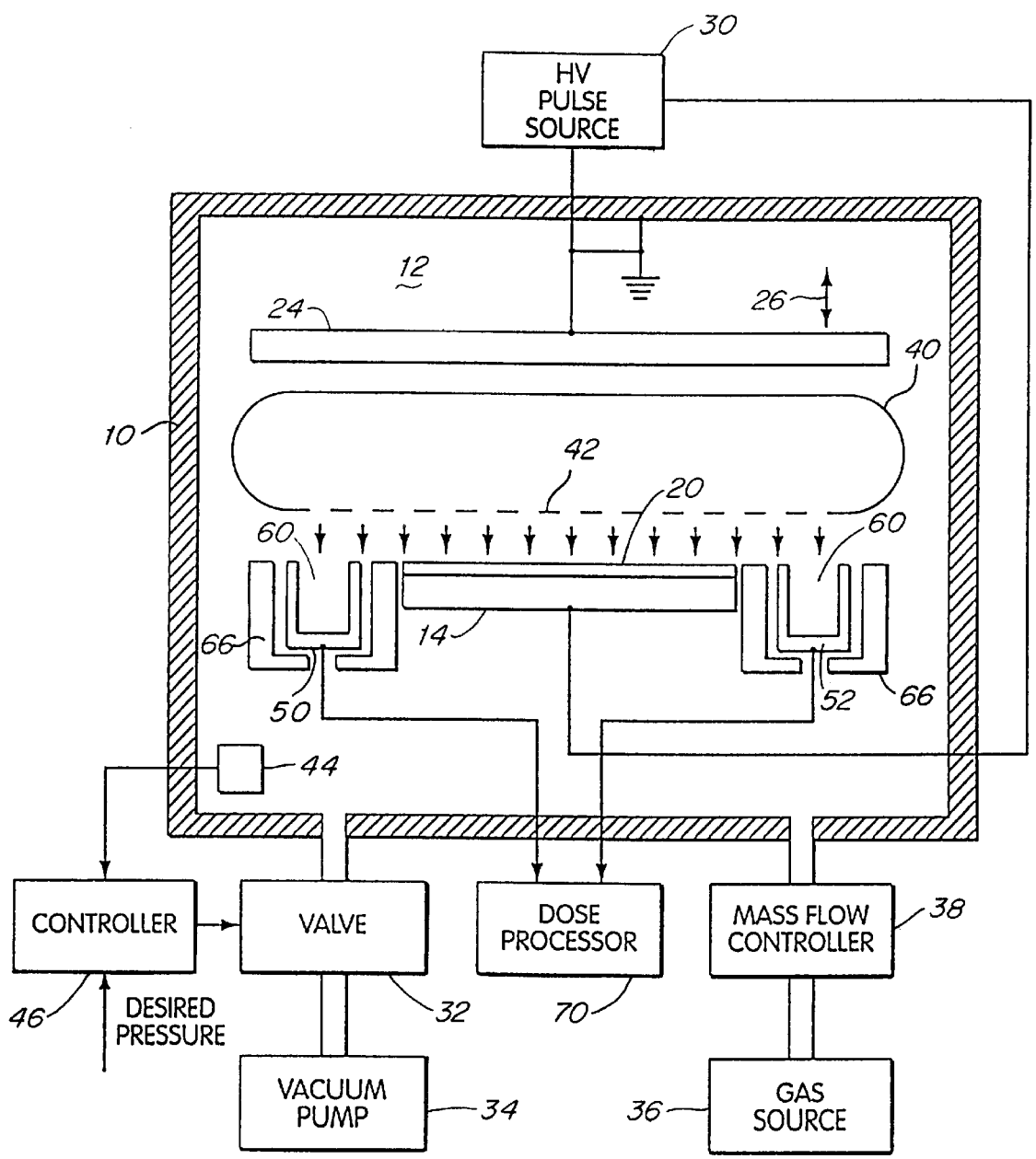
FIG. 1 is a simplified schematic block diagram of a plasma doping system incorporating Faraday cups.

An example of plasma doping system incorporating one or more Faraday cups is shown schematically in FIG. 1. A plasma doping chamber 10 defines an enclosed volume 12. A platen 14 positioned within chamber 10 provides a surface for holding a workpiece, such as a semiconductor wafer 20. The wafer 20 may, for example, be clamped at its periphery to a flat surface of platen 14. The platen 14 supports wafer 20 and provides an electrical connection to wafer 20. In one embodiment, the platen has an electrically-conductive surface for supporting wafer 20. In another embodiment, the platen includes conductive pins for electrical connection to wafer 20.

An anode 24 is positioned within chamber 10 in spaced relation to platen 14. Anode 24 may be movable in a direction, indicated by arrow 26, perpendicular to platen 14. The anode 24 is typically connected to electrically-conductive walls of chamber 10, both of which may be connected to ground.

The wafer 20 and the anode 24 are connected to a high voltage pulse generator 30, so that wafer 20 functions as a cathode. The pulse generator 30 typically provides pulses in a range of about 100 to 5000 volts, about 1 to 50 microseconds in duration and a pulse repetition rate of about 100 Hz to 2 KHz. It will be understood that these pulse parameter values are given by way of example only and that other values may be utilized within the scope of the invention.

The enclosed volume 12 of chamber 10 is coupled through a controllable valve 32 to a vacuum pump 34. A gas source 36 is coupled through a mass flow controller 38 to chamber 10. A pressure sensor 44 located within chamber 10 provides a signal indicative of chamber pressure to a controller 46. The controller 46 compares the sensed chamber pressure with a desired pressure input and provides a control signal to valve 32. The control signal controls valve 32 so as to minimize the difference between the chamber pressure and the desired pressure. Vacuum pump 34, valve 32, pressure sensor 44 and controller 46 constitute a closed loop pressure control system. The pressure is typically controlled in a range of about one millitorr to about 500 millitorr, but is not limited to this range. Gas source 36 supplies an ionizable gas containing a desired dopant for implantation into the workpiece. Examples of ionizable gas include $BF_3$, $N_2$, Ar, $PF_5$ and $B_2H_6$. Mass flow controller 38 regulates the rate at which gas is supplied to chamber 10. The configuration shown in FIG. 1. provides a continuous flow of process gas at a constant gas flow rate and constant pressure. The pressure and gas flow rate are preferably regulated to provide repeatable results.

In operation, wafer 20 is positioned on platen 14. Then the pressure control system, mass flow controller 38 and gas source 36 produce the desired pressure and gas flow rate within chamber 10. By way of example, the chamber 10 may operate with $BF_3$ gas at a pressure of 10 millitorr. The pulse generator 30 applies a series of high voltage pulses to wafer 20, causing formation of a plasma 40 between wafer 20 and anode 24. As known in the art, the plasma 40 contains positive ions of the ionizable gas from gas source 36. The plasma 40 further includes a plasma sheath 42 in the vicinity of platen 14. The electric field that is present between anode 24 and platen 14 during the high voltage pulse accelerates positive ions from plasma 40 across plasma sheath 42 toward platen 14. The accelerated ions are implanted into wafer 20 to form regions of impurity material. The pulse voltage is selected to implant the positive ions to a desired depth in wafer 20. The number of pulses and the pulse duration are selected to provide a desired dose of impurity material in wafer 20. The current per pulse is a function of pulse voltage, gas pressure and species and any variable position of the electrodes. For example, the cathode to anode spacing may be adjusted for different voltages.

Figure 2:
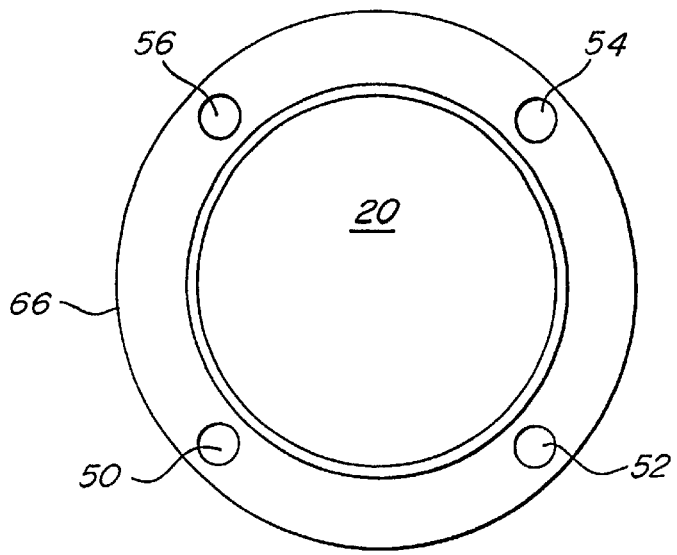
FIG. 2 is a partial schematic cross-sectional view of the plasma doping system of FIG. 1, showing the wafer and the Faraday cups.

One or more Faraday cups are positioned adjacent to platen 14 for measuring the ion dose implanted into wafer 20. In the embodiment of FIGS. 1 and 2, Faraday cups 50, 52, 54 and 56 are equally spaced around the periphery of wafer 20. Each Faraday cup comprises a conductive enclosure having an entrance 60 facing plasma 40. Each Faraday cup is preferably positioned as close as is practical to wafer 20 and intercepts a sample of the positive ions accelerated from plasma 40 toward platen 14.

The Faraday cups are electrically connected to a dose processor 70 or other dose monitoring circuit. As known in the art, positive ions entering each Faraday cup through entrance 60 produce a current in the electrical circuit connected to the Faraday cup. The electrical current is indicative of the number of positive ions received per unit time, or ion current. It is assumed that the ion currents received by Faraday cups 50, 52, 54 and 56 have a fixed relation to the number of ions.implanted in wafer 20 per unit time. Depending on the uniformity of plasma 40 and the uniformity of ion acceleration toward platen 14, the ion current per unit area received by each Faraday cup may be substantially equal to or a fixed fraction of the ion current per unit area implanted in wafer 20. Since the electrical current output of each of the Faraday cups is representative of thc ion current implanted in wafer 20, the Faraday cups 50, 52, 54 and 56 provide a measurement of the ion dose implanted in wafer 20.

As described in U.S. Pat. No. 5,711,812 issued Jan. 27, 1998 to Chapek et al, the plasma doping system may include a guard ring 66 that surrounds platen 14. The guard ring 66 is biased to insure a relatively uniform distribution of implanted ions near the edge of wafer 20. The Faraday cups 50, 52, 54 and 56 may be positioned within guard ring 66 near the periphery of wafer 20 and platen 14.

Figure 3:
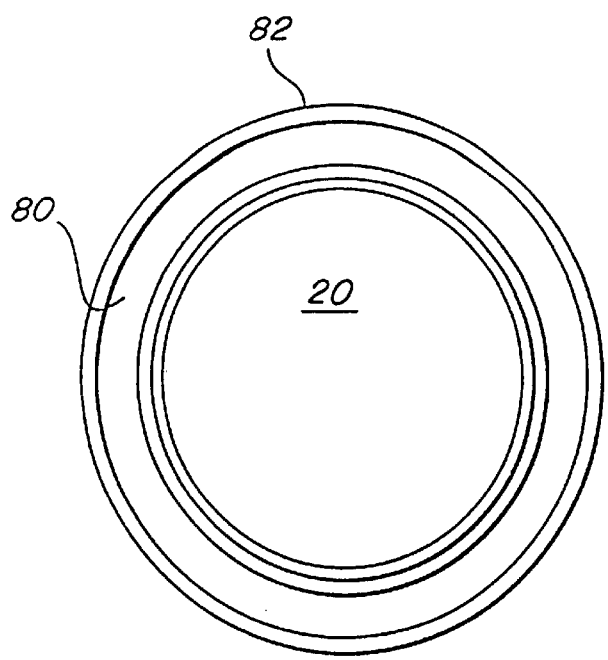
FIG. 3 is a partial schematic cross-sectional view of a plasma doping system incorporating an annular Faraday cup.

It will be understood that a variety of different Faraday cup configurations may be utilized. A second embodiment is shown in FIG. 3. An annular Faraday cup 80 is positioned around wafer 20 and platen 14. The annular Faraday cup 80 has the advantage that localized variations in ion current are averaged around the periphery of wafer 20. Faraday cup 80 may be positioned in an annular guard ring 82. In general, any configuration of one or more Faraday cups may be utilized. The Faraday cups are preferably located as close as is practical to wafer 20 and platen 14. However, the Faraday cups may have any positions relative to wafer 20 that provide a measurement representative of ion current implanted into wafer 20.

As indicated above, an electrical signal representative of ion current is supplied from the Faraday cup or cups to dose processor 70. In one embodiment, the electrical current from each Faraday cup is supplied directly to dose processor 70 located external to chamber 10. In another embodiment, a preprocessing circuit (not shown) may be located in close proximity to platen 14 and may operate at the voltage of platen 14. The circuit preprocesses the outputs of the Faraday cups and supplies a result to dose processor 70.

The total ion dose delivered to wafer 20 is the instantaneous ion current integrated over the time of the implant. The dose processor 70 typically includes a circuit for integrating the outputs of the Faraday cups. The integrator may utilize conventional integrator circuits, charge sensitive amplifiers, or any other suitable circuit for performing the integration function. Where the system includes two or more Faraday cups, the outputs may be averaged to determine total dose. Dose processor configurations are known in connection with conventional high energy ion implanters.

Two or more Faraday cups may be utilized to obtain a measure of dose uniformity. Dose uniformity is the uniformity of implanted ions over the surface area of wafer 20. With reference to FIG. 2, when the implanted ion dose in wafer 20,is uniform, Faraday cups 50, 52, 54 and 56 receive equal ion currents. When the dose is not uniform, the Faraday cups receive different ion currents. Accordingly, the current outputs of the Faraday cups may be compared with each other or with a reference to obtain a measure of uniformity. Thus, for example, if one or more of the Faraday cups provide an ion current that is different from the others, non-uniform ion implantation is indicated. The indication of non-uniform implantation may, for example, be used to control the process, such as by stopping or altering the ion implantation.

The Faraday cup or cups used in the plasma doping system may have a variety of different configurations. In a basic configuration illustrated in FIG. 1, entrance 60 of each Faraday cup may be coplanar with the surface of wafer 20 facing plasma 40. Each Faraday cup may be at the same electrical potential as platen 14 so as to minimize any disturbance to plasma 40 by the Faraday cups.

The Faraday cup collects incoming charges and provides an electrical signal that represents the net arrival rate of the charges. Therefore, secondary electrons which escape from the Faraday cup introduce errors in the measurement of the ion current. For Faraday cups that operate in high vacuum, the common practice is to apply an electric field and/or a magnetic field at the entrance to the cup, so that secondary electrons emitted as a result of ion bombardment of the cup cannot escape from the Faraday cup. Therefore the output signal is an accurate measurement of the incoming ion beam current. Another way to stop the escape of secondary electrons is to design the Faraday cup geometry in such a way that the electrons collide with the Faraday cup wall many times, and the probability of escape is low. The same principles apply to Faraday cups which operate at lower vacuum, but precautions are needed to prevent additional ionization processes within the Faraday cup.

Plasma doping systems operate at lower vacuum (higher pressure) than conventional beamline ion implantation systems. The gas pressure in the Faraday cup is the same as the pressure in the plasma chamber. As a plasma is formed in the chamber, the strongest electric field is within the plasma sheath. When an electric field exists in the vicinity of the Faraday cup, gas molecules near the cup opening may be ionized and enhance a local discharge. Such enhancement is related to the geometric shape and dimension of the cup opening. It is known in the art that a cylindrical shape can enhance the local plasma density up to two orders of magnitude due to the hollow cathode effect. The enhanced local discharge near the cup opening can extend into the cup to fill the entire interior chamber of the cup. Discharge within the Faraday cup disturbs the surrounding plasma, reducing the uniformity of ion implantation in the wafer. It also makes the Faraday cup output signal useless, as it is no longer an indication of incident ion current.

The onset of discharge in the Faraday cup is a function of Faraday cup geometry, material and surface condition, gas type and pressure, voltage applied to the plasma and current drawn from the plasma. A key factor in the onset of the discharge is the ratio of Faraday cup opening size to plasma sheath thickness in a direction normal to the platen. If this ratio is larger than one, the plasma sheath edge may be deformed by the opening, and such a deformation changes the local electric field distribution. The change of electric field distribution accelerates the deformation process and eventually leads to a discharge within the Faraday cup. If this ratio is less than one, any deformation of the plasma sheath edge is minimal, and normal operation of the Faraday cup as well as uniform ion implantation can be maintained.

Figure 4:
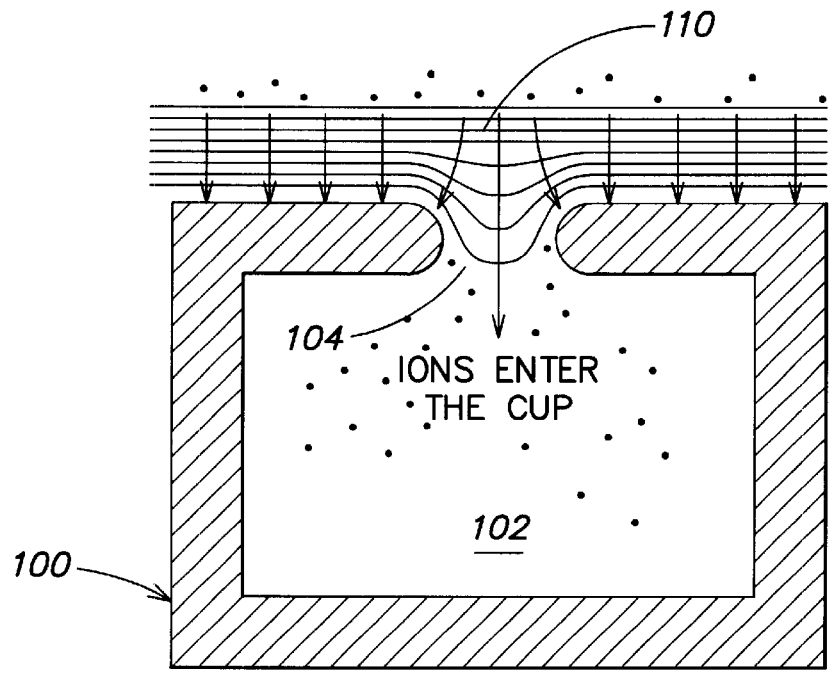
FIG. 4 is a schematic cross-sectional diagram of a Faraday cup, illustrating a relatively thick plasma sheath that does not produce a discharge in the interior chamber of the Faraday cup.

A Faraday cup 100 having an interior chamber 102 and an opening 104 is shown in FIG. 4. A relatively thick plasma sheath 110 is formed adjacent to opening 104. Equipotential lines are shown in FIG. 4 to represent the electric field distribution near opening 104. The plasma sheath 110 is minimally disturbed by opening 104, and no enhanced local discharge is formed near opening 104 and in the interior chamber 102.

Figure 5:
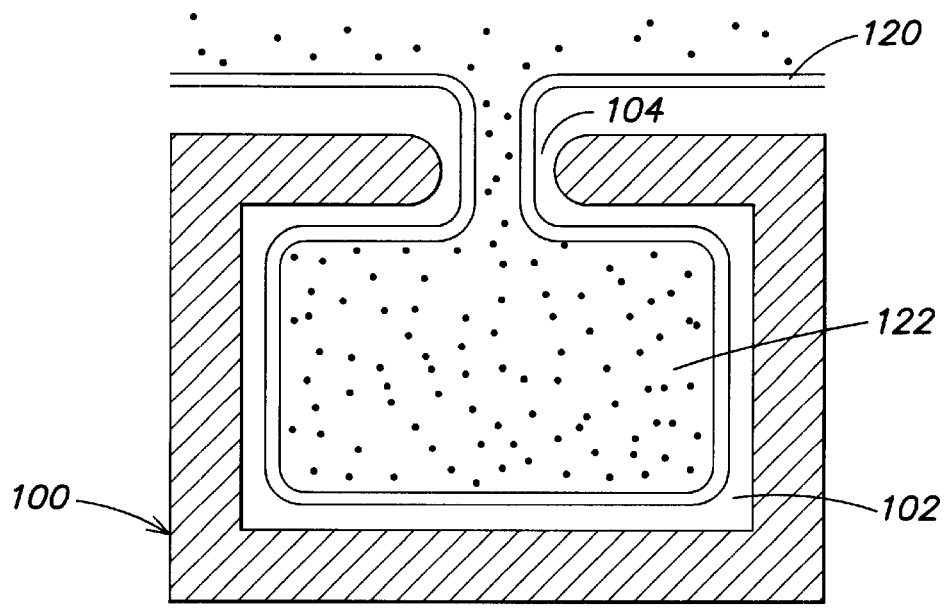
FIG. 5 is a schematic cross-sectional diagram of a Faraday cup, illustrating a relatively thin plasma sheath that produces a discharge within the interior chamber of the Faraday cup.

FIG. 5 shows Faraday cup 100 for the case of a relatively thin plasma sheath 120. The plasma sheath 120 is significantly disturbed by opening 104, causing a discharge 122 to form in interior chamber 102. As noted above, the discharge reduces the uniformity of ion implantation and renders the Faraday cup useless for ion current measurement.

Plasma sheath thickness is a function of plasma density and the voltage applied to the plasma. Higher density and lower voltage produce a thinner plasma sheath. Plasma doping requires a plasma density that is sufficiently high to complete ion implantation within a short time. High plasma density is usually achieved by increasing the gas pressure at low implantation voltages. This makes the plasma sheath thinner and increases the risk of Faraday cup discharge. The effective range for using the Faraday cup as a dose monitor is therefore limited due to this discharge problem.

Figure 6:
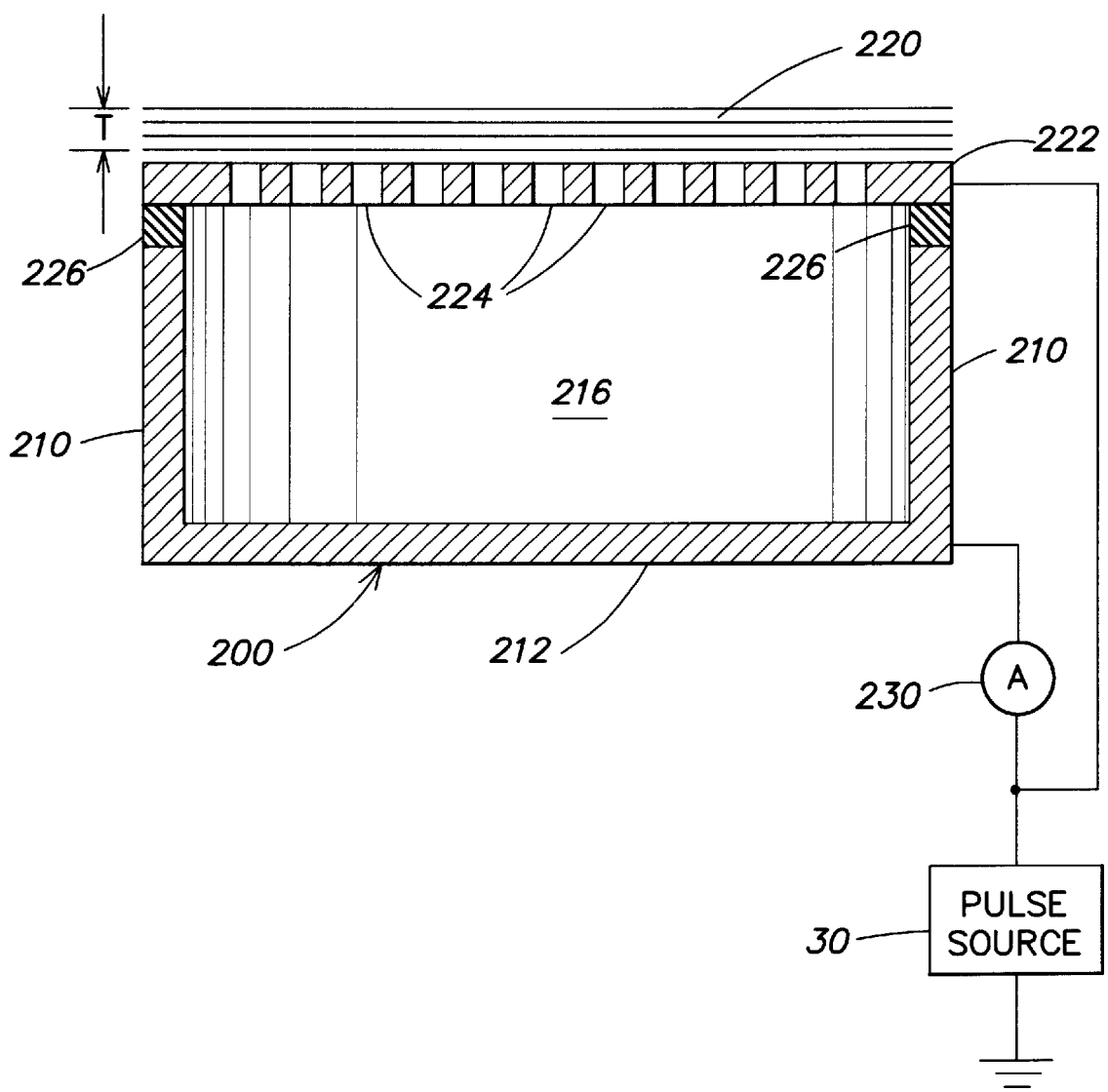
FIG. 6 is a schematic cross-sectional view of a Faraday cup incorporating a cover having a plurality of apertures.
Figure 7:
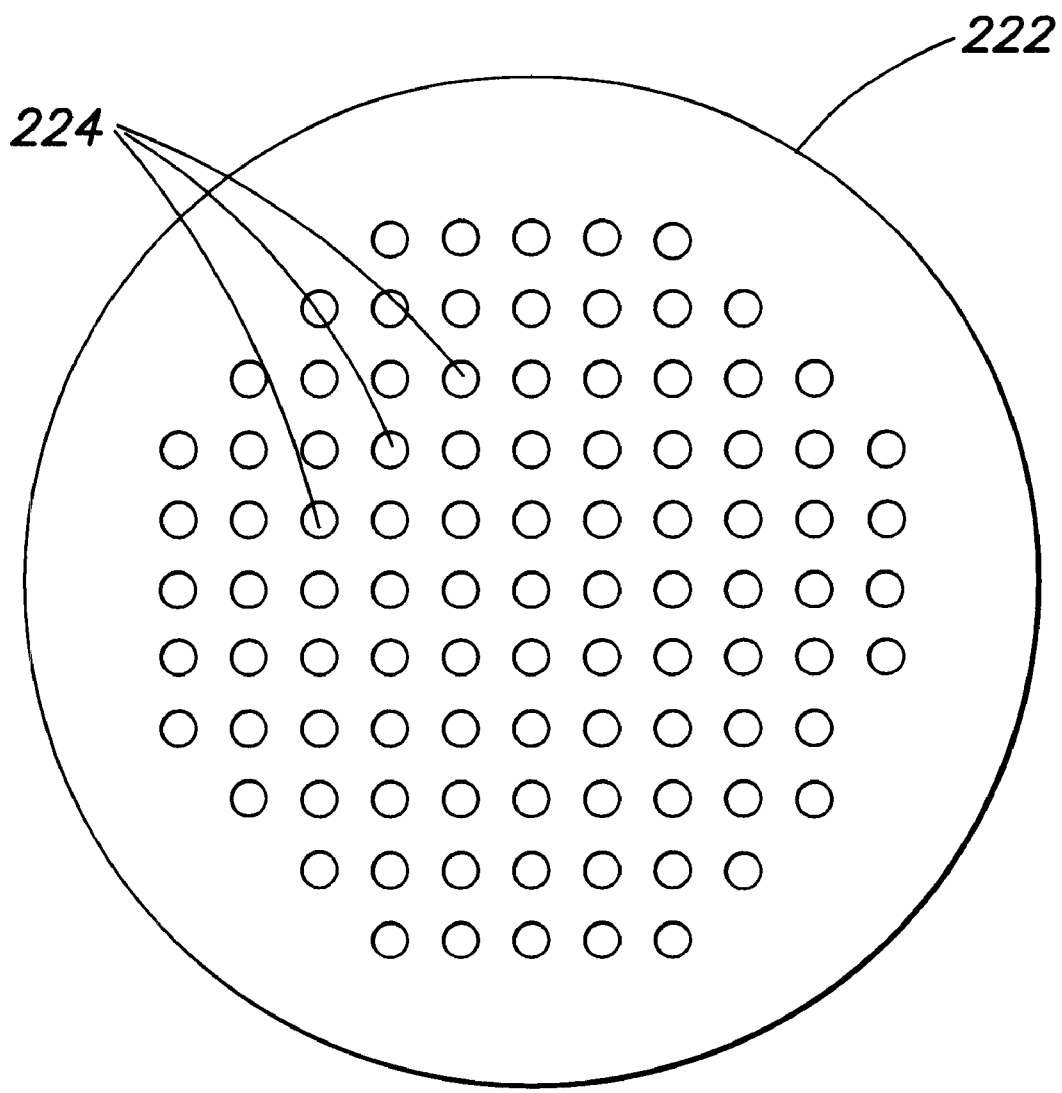
FIG. 7 is a schematic top view of the Faraday cup cover shown in FIG. 5.
Figure 8:
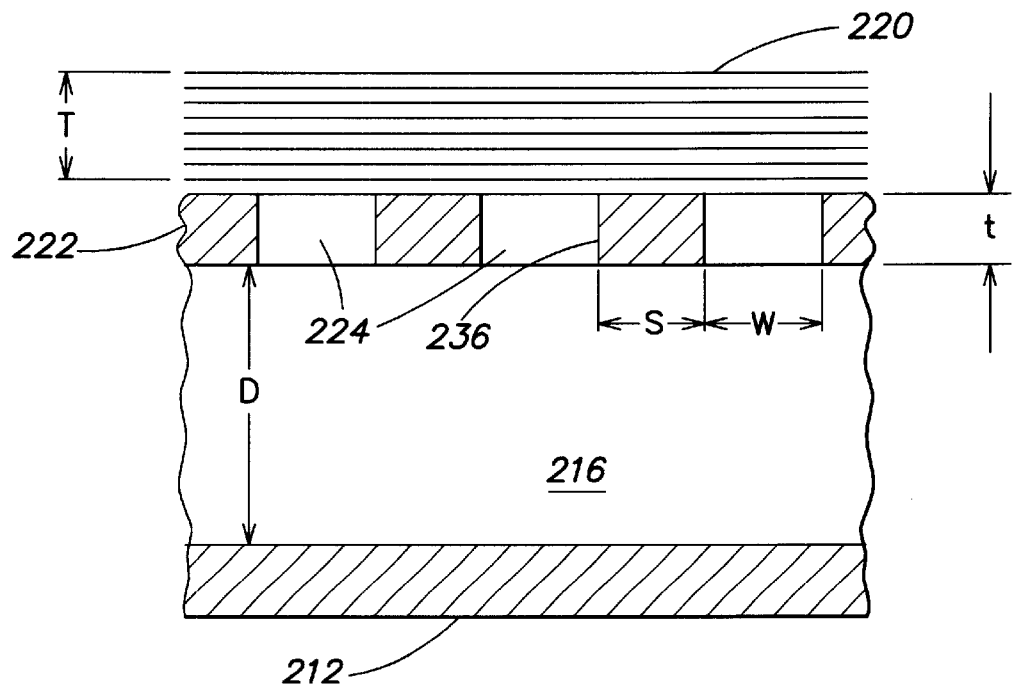
FIG. 8 is an enlarged partial cross-sectional view of the Faraday cup shown in FIG. 6.

A Faraday cup 200 having a configuration which reduces the risk of discharge within the Faraday cup is shown in FIGS. 6–8. Like elements in FIGS. 6–8 have the same reference numerals. Faraday cup 200 includes a sidewall 210 a bottom wall 212 which define an interior chamber 216. Sidewall 210 may be cylindrical. An end of Faraday cup 200 facing plasma sheath 220 is provided with a cover 222 having multiple apertures 224. In the example of FIG. 6, cover 222 is a conductive multi-aperture plate. Ions enter tile interior chamber 216 of Faraday cup through apertures 224 and are detected. The purpose of the multi-aperture cover 222 is to reduce the ratio of the aperture width W (see FIG. 8) to the plasma sheath thickness T, preferably to a value less than one, and thereby reduce the risk of discharge in the interior chamber 216 of the Faraday cup. The cover 222 is electrically isolated from sidewall 210 by an insulator 226.

The cover 222 may be configured such that the total opening area of apertures 224 is the same or nearly the same as the area of a single large aperture, so that the incident current remains the same or nearly the same. The electric field in front of the multi-aperture cover 222 is much more flat than the electric field in front of a single larger aperture. The general rule is that, at a distance away from the multi-aperture cover which is greater than the width of each aperture, the electric field is substantially the same with or without the apertures. For plasma doping processes which produce a thin plasma sheath, the sheath thickness is still greater than the width of each aperture. Electrons and ions at the plasma edge are not influenced by these apertures, and the plasma is not disturbed. This eliminates the discharge problem within the Faraday cup and extends the operational range of the Faraday cup to higher pressures and lower voltages.

The sidewall 210 and bottom wall 212 of Faraday cup 200 may be connected through a current sensing device 230 to pulse source 30. Cover 222 may be connected to pulse source 30 but is not connected through current sensing device 230. Preferably, pulse source 30 supplies the same pulse to platen 14 (FIG. 1) and to Faraday cup 200, including cover 222, so that a uniform electric field is seen by the plasma. The pulse voltage corresponds to the desired implant energy and is typically in a range of about 100 volts to 5000 volts. The output of current sensing device 230 is an electrical signal that is representative of the number of ions entering interior chamber 216 of Faraday cup 200, but excludes ions that are incident on cover 222. Current sensing device 230, for example, may be a Pearson coil or a battery operated circuit which floats at the same potential as the pulse source 30.

An enlarged partial cross-sectional view of Faraday cup 200 is shown in FIG. 8. The width W of each aperture 224 in plate 222 is preferably less than the thickness T of plasma sheath 220 under operating conditions of the plasma doping system which produce a thin plasma sheath. The apertures 224 may be circular, elongated or otherwise shaped such that at least one dimension is less than the thickness of the plasma sheath. A spacing S between apertures 224 is preferably minimized to provide a large total area of apertures 224. The spacing S between apertures 224 may be on the order of the width W of apertures 224 or less. A thickness t of cover 222 is preferably minimized to a value required for structural integrity in order to reduce the number of ions intercepted by a wall 236 of aperture 224. A depth D of Faraday cup 200, that is the spacing between multi-aperture cover 222 and bottom wall 212, is preferably long enough that escape of secondary electrons is minimized.

The cover shown in FIGS. 6-8 and described above is implemented as a multi-aperture plate. It will be understood that different cover configurations may be utilized within the scope of the invention. Any cover having apertures of suitable size to prevent discharge within the Faraday cup may be utilized. The cover may be fabricated of the same material as the workpiece to limit contamination of the workpiece. Thus, for example, the cover-may be fabricated of silicon where silicon wafers are being implanted. In another embodiment, a wire mesh or screen may be utilized as a cover. The spacing between wires in the wire mesh is preferably selected to provide apertures having widths that are less than the thickness of the plasma sheath.

Figure 9:
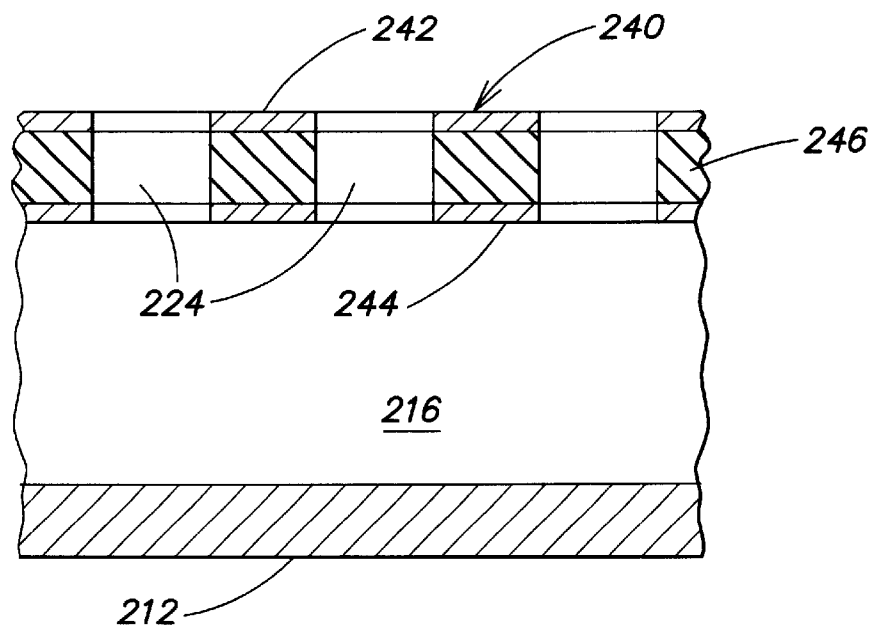
FIG. 9 is a schematic cross-sectional view of a Faraday cup having a cover with a plurality of apertures and an electrode for repelling electrons.

A further embodiment of the multi-aperture cover is shown schematically in FIG. 9. Like elements in FIGS. 6–9 have the same reference numerals. A multi-aperture cover 240 includes a front electrode 242 and a back electrode 244 separated by an insulator 246. Apertures 224 are formed through front electrode 242, insulator 246 and back electrode 244. Front electrode 242 may be connected to pulse source 30 (FIG. 6) to ensure that the plasma sees a uniform electric field. Back electrode 244, which faces the interior chamber 216 of the Faraday cup, may be biased to repel electrons. For example, back electrode 244 may be biased negatively with respect to bottom wall 212. Thus, back electrode 244 inhibits escape of secondary electrons from interior chamber 216 through apertures 224.

The Faraday cup configuration described above works well for low incident ion densities. The following feature of the invention deals with the case of high ion densities. Ions generated in the plasma enter the Faraday cup through its front opening, forming a positive charge column within the cup. The charge density within the column is given by the ion flux divided by ion velocity. When the ion density is high enough, the electric field created by these ions becomes significant. This effect, known as the space charge effect, must be taken into consideration when the ion density is above $10^8$ ions per cubic centimeter. For plasma doping processes, the ion density entering the Faraday cup can be one or two orders of magnitude higher than $10^8$ ions per cubic centimeter, depending on implantation parameters. The space charge effect causes ions to repel each other, so the cross section of the ion beam increases. When electrons are present, the positive charge column functions as an electron trap. In other words, the positive charge column forms a potential well, and electrons falling into the well cannot escape unless they receive sufficient energy from external sources. A few electrons may be bounced out of the trap due to collision, but most electrons move along the column, in a direction opposite the ions, and may leave the Faraday cup. Electrons leaving the Faraday cup introduce errors in the output signal. Therefore it is important to separate the electrons and the positive charge column and to retain the electrons inside the cup in order to ensure an accurate ion current measurement.

Figure 10:
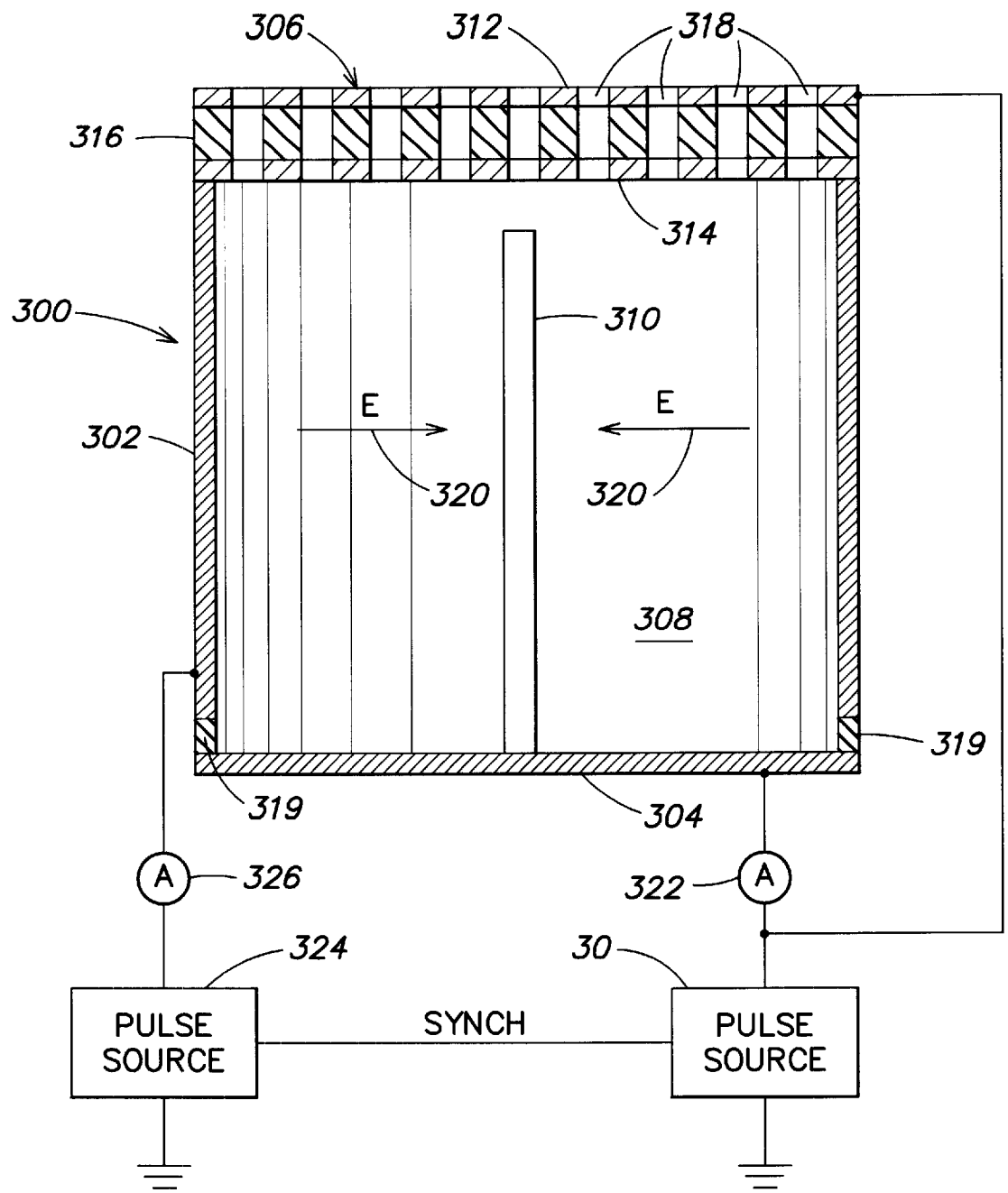
FIG. 10 is a schematic cross-sectional view of a Faraday cup having an axial electrode for producing a lateral electric field within the interior chamber of the Faraday cup.

A Faraday cup configuration having reduced probability of electrons leaving the cup is shown in FIG. 10. A Faraday cup 300 includes a sidewall 302, a bottom wall 304, multi-aperture cover 306 and an electrode 310. Sidewall 302, bottom wall 304 and cover 306 define an interior chamber 308 of Faraday cup 300. Multi-aperture cover 306 may include a front electrode 312 and a back electrode 314 separated by an insulator 316. Apertures 318 are formed through front electrode 312, insulator 316 and back electrode 314. In the embodiment of FIG. 10, sidewall 302 is cylindrical, and electrode 310 comprises a pin or rod located on the axis of the cylindrical sidewall. Electrode 310 is electrically connected to bottom wall 304, and sidewall 302 is electrically connected to the back electrode 314 of multi-aperture cover 306. Sidewall 302 is electrically isolated from bottom wall by an insulator 319. Electrode 310 is biased relative to sidewall 302 so as to produce within interior chamber 308 an electric field 320 that is lateral to the direction of ions entering Faraday cup 300. Thus, bottom wall 304 and center electrode 310 may be connected through a current sensing device 322 to pulse source 30, front electrode 312 of cover 306 may be connected to pulse source 30, and sidewall 302 and back electrode 314 of cover 306 may be connected to a pulse source 324 through a current sensing device 326. The combined signal from current sensing devices 322 and 326 provides an accurate measurement of the ion current. Pulse sources 30 and 324 arc synchronized and produce pulses which bias sidewall 302 positively relative to center electrode 310. In the cylindrical configuration of FIG. 10, the electric field 320 is radial and causes electrons to be pushed away from the positive charge column of the ion beam.

The potential well created by the positive charge column is proportional to the charge density and cross sectional area of the column. The potential difference from the center to the edge of a 1 millimeter diameter charge column of density $3 \times 10^9$ ions per cubic centimeter is about 3.4 volts. The electric field strength at the column edge is approximately 136 volts per centimeter. To push the electrons out of the potential well, a horizontal field that is greater than the electric field created by the positive charge column is required. This horizontal field is introduced by applying a voltage between the center electrode 310 and the sidewall 302 of the Faraday cup. The electric field is strong enough to push electrons to the sidewall 302, which acts as an electron collector, before the electrons leave the Faraday cup. The center electrode 310 and the bottom wall 304 act as an ion collector. The net current (current from the ion collector minus the current from the electron collector) gives an accurate measurement of incident ion current. For a Faraday cup of one inch diameter, the required voltage is approximately 200 volts. It is important to keep the voltage low enough to avoid gas breakdown within the Faraday cup. For $BF_3$ gas commonly used in plasma doping, the minimum breakdown voltage is about 500 volts. By way of example only, pulses having amplitudes of -1 kilovolt may be applied to electrode 310 and,bottom wall 304, and simultaneous pulses having amplitudes of -800 volts may be applied to sidewall 302 and the back electrode 314 of multi-aperture cover 306.

Figure 11:
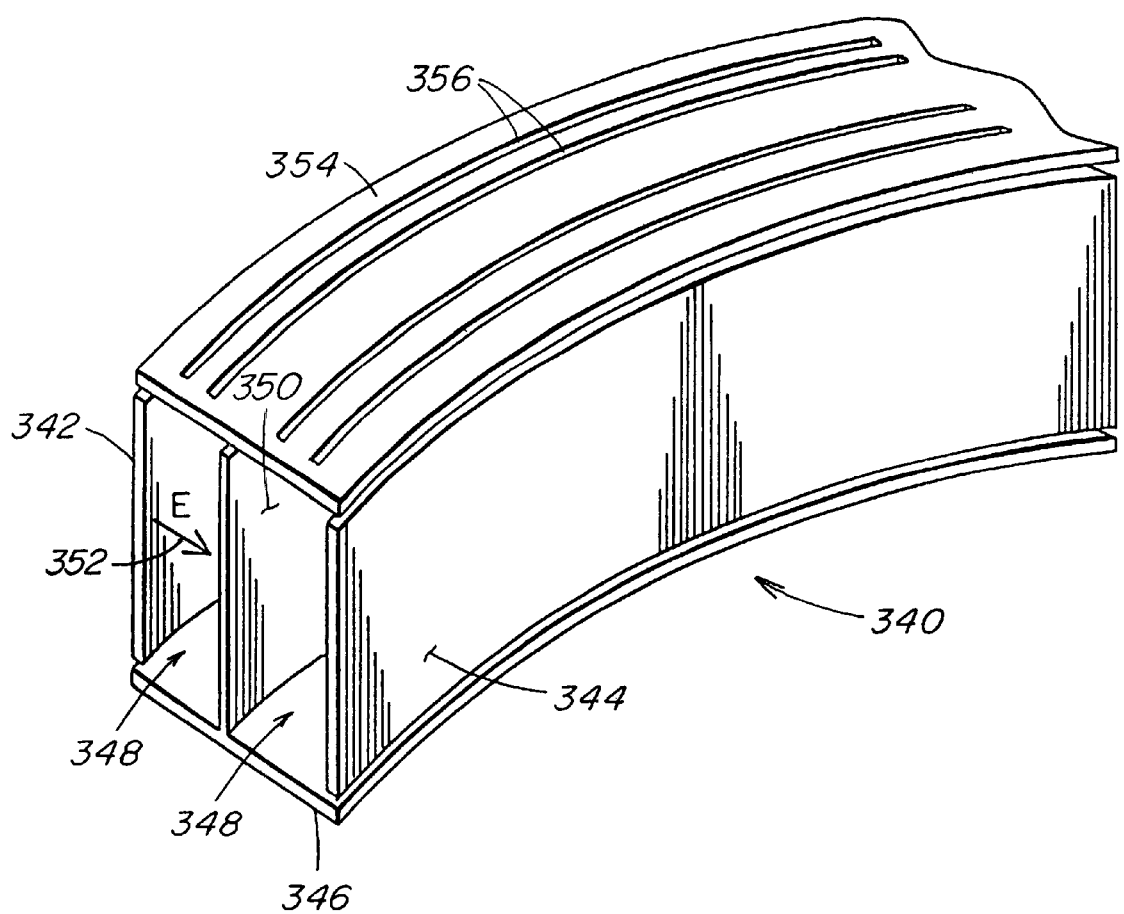
FIG. 11 is a partial perspective view of an annular Faraday cup having an annular electrode for producing a lateral electric field within the interior chamber of the Faraday cup.

A Faraday cup configuration which produces a lateral electric field in an annular Faraday cup is shown in FIG. 11. A Faraday cup 340 includes an outer annular wall 342, an inner annular wall 344, a bottom annular wall 346 and a cover 354. An electrode 350 is disposed between outer wall 342 and inner wall 344. Electrode 350 is biased to produce within interior chamber 348 of Faraday cup 340 an electric field 352 lateral to the direction of ions entering the Faraday cup. Electric field 352 is radial in the annular Faraday cup and pushes electrons away from the positive charge column produced by the ions entering the Faraday cup. Electrode 350 has an annular configuration and is electrically connected to bottom wall 346. The voltage pulses applied to outer wall 342, inner wall 344 and electrode 350 are selected to produce lateral electric fields within the interior chamber 348 of the Faraday cup to push electrons away from the positive charge column. Cover 354 may be provided with multiple apertures 356, which may be arc-shaped slots. As described above, the width of each aperture is preferably less than the thickness of the plasma sheath in the plasma doping chamber.

In another embodiment, outer wall 342 is electrically isolated from inner wall 344, and electrode 350 is not utilized. In this embodiment, outer wall 342 is biased relative to inner wall 344 to produce a lateral electric field in the interior chamber 348 of the Faraday cup. Thus, for example, the voltage pulses applied to outer wall 342 and inner wall 344 may differ in pulse amplitude by a selected voltage, such as 200 volts, to provide the desired lateral electric field.

As described above in connection with FIGS. 6–9, the Faraday cup may include a multi-aperture cover for reducing the risk of discharge within the Faraday cup. As further described above in connection with FIGS. 10 and 11, the Faraday cup may be configured, such as by incorporating an electrode, to produce a lateral electric field for suppressing the escape of electrons from the interior chamber of the Faraday cup. It will be understood that these features may be utilized separately or in combination within the scope of the present invention. For example, electrode 350 may be omitted from the annular Faraday cup 340 with multi-aperture cover 356. Alternatively, Faraday cup 340 with electrode 350 may utilize a cover with a single annular aperture.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A Faraday cup for sensing an ion beam, comprising:
   a sidewall and a bottom wall defining an interior chamber, said interior chamber having an opening; and
   means for producing within the interior chamber of said Faraday cup an electric field lateral to the direction of ions entering said Faraday cup.

2. A Faraday cup as defined in claim 1 wherein said means for producing an electric field comprises an electrode located within the interior chamber of said Faraday cup and means for coupling a supply voltage to said electrode for biasing the electrode with respect to the sidewall of said Faraday cup.

3. A Faraday cup as defined in claim 1 wherein the interior chamber comprises a cylindrical interior chamber and wherein said means for producing an electric field comprises an axial conductor located within the interior chamber.

4. A Faraday cup as defined in claim 1 wherein said sidewall includes an annular outer wall and an annular inner wall, wherein said means for producing an electric field comprises an annular electrode located between said inner and outer walls.

5. A Faraday cup as defined in claim 1 wherein said sidewall includes an annular outer wall and an annular inner wall, wherein said means for producing an electric field comprises means for applying a voltage between said inner and outer walls for producing said electric field within the interior chamber of said Faraday cup.

6. A Faraday cup as defined in claim 1 further comprising a cover disposed over said opening, said cover having a plurality of apertures for allowing ions to enter the interior chamber.

* * * * *